(12) United States Patent
Miura et al.

(10) Patent No.: US 12,294,196 B2
(45) Date of Patent: *May 6, 2025

(54) LIGHT EMITTING DEVICE

(71) Applicant: NICHIA CORPORATION, Anan (JP)

(72) Inventors: Soichiro Miura, Tokushima (JP); Ryota Okuno, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/495,403

(22) Filed: Oct. 26, 2023

(65) Prior Publication Data

US 2024/0055828 A1 Feb. 15, 2024

Related U.S. Application Data

(63) Continuation of application No. 18/149,241, filed on Jan. 3, 2023, now Pat. No. 11,876,342, which is a
(Continued)

(30) Foreign Application Priority Data

Oct. 31, 2019 (JP) ................................. 2019-198334

(51) Int. Cl.
  *H01S 5/02326* (2021.01)
  *H01S 5/02253* (2021.01)
  *H01S 5/02325* (2021.01)

(52) U.S. Cl.
  CPC ...... *H01S 5/02326* (2021.01); *H01S 5/02253* (2021.01); *H01S 5/02325* (2021.01)

(58) Field of Classification Search
  CPC .................................................. H01S 5/02255
  See application file for complete search history.

(56) References Cited

U.S. PATENT DOCUMENTS

| 6,714,564 B1 | 3/2004 | Meyers |
| 7,166,489 B2 | 1/2007 | Kim |

(Continued)

FOREIGN PATENT DOCUMENTS

| JP | H01-101511 | * | 4/1989 |
| JP | H01-101511 A | | 4/1989 |

(Continued)

OTHER PUBLICATIONS

Final Office Action in U.S. Appl. No. 17/069,299 dated Jun. 28, 2022.
(Continued)

*Primary Examiner* — Tuan N Nguyen
(74) *Attorney, Agent, or Firm* — Foley & Lardner LLP

(57) ABSTRACT

A light emitting device includes: a laser element; a case enclosing the laser element, the case including a light-transmissive region configured to allow light emitted from the laser element to transmit through the light-transmissive region; a first lens configured to collimate or converge light emitted from the laser element; and a second lens that is disposed in the case and spaced apart from the first lens, the second lens located in an optical path between the laser element and the first lens. The second lens is spaced apart from the light-transmissive region such that an open space is located in the case between the light-transmissive region and the second lens.

15 Claims, 11 Drawing Sheets

Related U.S. Application Data continuation of application No. 17/069,299, filed on Oct. 13, 2020, now Pat. No. 11,575,243.

(56) References Cited

U.S. PATENT DOCUMENTS

| | | | |
|---|---|---|---|
| 7,453,916 B2 | 11/2008 | Li et al. | |
| 9,209,605 B1 | 12/2015 | Guo et al. | |
| 10,153,608 B2 | 12/2018 | Hemenway et al. | |
| 10,218,151 B1* | 2/2019 | Hwang | H01S 5/02255 |
| 10,431,959 B2 | 10/2019 | Miura et al. | |
| 2003/0091277 A1 | 5/2003 | Mei | |
| 2003/0103276 A1 | 6/2003 | Togashi et al. | |
| 2004/0184753 A1 | 9/2004 | Teramura et al. | |
| 2009/0245315 A1 | 10/2009 | Faybishenko | |
| 2009/0323752 A1 | 12/2009 | Chuyanov et al. | |
| 2013/0021581 A1 | 1/2013 | Takahashi et al. | |
| 2013/0272329 A1 | 10/2013 | Auen et al. | |
| 2014/0215816 A1 | 8/2014 | Kurokawa et al. | |
| 2014/0339509 A1 | 11/2014 | Choi et al. | |
| 2016/0111850 A1 | 4/2016 | Muendel et al. | |
| 2016/0126696 A1 | 5/2016 | Gudeman | |
| 2016/0306265 A1 | 10/2016 | Riel et al. | |
| 2017/0141531 A1 | 5/2017 | Kyono et al. | |
| 2017/0317467 A1* | 11/2017 | Miura | H01S 5/4031 |
| 2019/0103723 A1 | 4/2019 | Miura et al. | |
| 2019/0121141 A1* | 4/2019 | Dykaar | H01S 5/4075 |
| 2019/0195442 A1 | 6/2019 | Miura | |
| 2019/0368685 A1 | 12/2019 | Miura | |
| 2020/0343685 A1 | 10/2020 | Tajiri | |

FOREIGN PATENT DOCUMENTS

| | | |
|---|---|---|
| JP | H05-129711 A | 5/1993 |
| JP | 2002-214482 A | 7/2002 |
| JP | 2003-172874 A | 6/2003 |
| JP | 2007-019301 A | 1/2007 |
| JP | 2014-149494 A | 8/2014 |
| JP | 2016-225448 A | 12/2016 |
| JP | 2017-059628 A | 3/2017 |
| JP | 2017-523467 A | 8/2017 |
| JP | 2019-114726 A | 7/2019 |
| JP | 2019-125614 A | 7/2019 |
| JP | 2019-207788 A | 12/2019 |
| WO | WO-2012/014798 A1 | 2/2012 |
| WO | WO-2016/051836 A1 | 4/2016 |

OTHER PUBLICATIONS

Non-Final Office Action in U.S. Appl. No. 17/069,299 dated Mar. 31, 2022.

Non-Final Office Action in U.S. Appl. No. 18/149,241 dated Apr. 20, 2023.

Notice of Allowance in U.S. Appl. No. 17/069,299 dated Oct. 17, 2022.

Notice of Allowance in U.S. Appl. No. 18/149,241 dated Jul. 31, 2023.

* cited by examiner

LIGHT EMITTING DEVICE

CROSS-REFERENCE TO RELATED APPLICATIONS

The present application is a continuation of U.S. patent application Ser. No. 18/149,241, filed Jan. 3, 2023, which is a continuation of U.S. patent application Ser. No. 17/069,299, filed Oct. 13, 2020 (now U.S. Pat. No. 11,575,243), which claims priority under 35 U. S. C. § 119 to Japanese Patent Application No. 2019-198334, filed Oct. 31, 2019. The contents of these applications are hereby incorporated by reference in their entireties.

BACKGROUND

The present disclosure relates to a light emitting device that includes a plurality of light emitting elements and a plurality of lenses.

A light emitting device having a plurality of semiconductor laser elements and a lens array is, for example, described in JP 2007-019301A.

SUMMARY

JP 2007-019301 A describes that, when the position of each light emitting region of two semiconductor laser elements has a mounting error, the angle of tilt of the lens array is adjusted to increase the parallelism of the collimated light. However, merely adjusting the tilt angle of the lens array may not enough to sufficiently improve the adjustment accuracy. Accordingly, a light emitting device allowing further improvement of adjustment accuracy has been needed.

A light emitting device according to one embodiment of the present disclosure includes a plurality of light emitting elements including a first light emitting element and a second light emitting element, a case enclosing the plurality of light emitting elements, the case having a light-transmissive region allowing light emitted from the plurality of light emitting elements to pass through, a plurality of main lenses covering at least a portion of the light-transmissive region, the plurality of main lenses including a first main lens to collimate or converge light emitted from the first light emitting element and a second main lens to collimate or converge light emitted from the second light emitting element, and a plurality of sub-lenses disposed in the case, the plurality of sub-lenses including a first sub-lens located in an optical path between the first light emitting element and the first main lens and a second sub-lens located in an optical path between the second light emitting element a11d the second lens.

With the light emitting device described above, the light emitted through the main lenses can be within a target quality range.

DETAILED DESCRIPTION

Before describing embodiments of the present disclosure, related art and findings obtained by the present inventors will be described.

Figure 1:
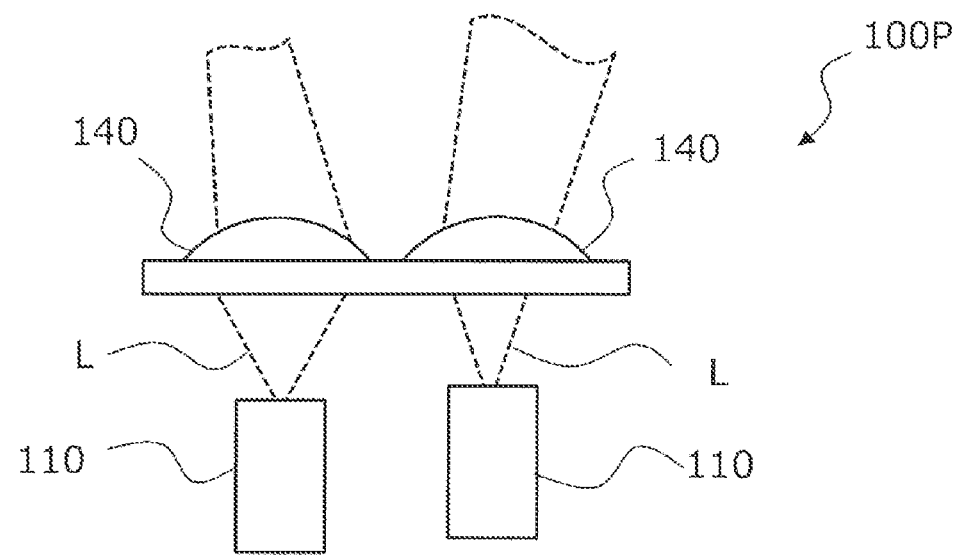
FIG. 1 is a diagram schematically showing a light emitting device having a plurality of light emitting elements and a plurality of collimating lenses, but not having a sub-lens.
Figure 2:
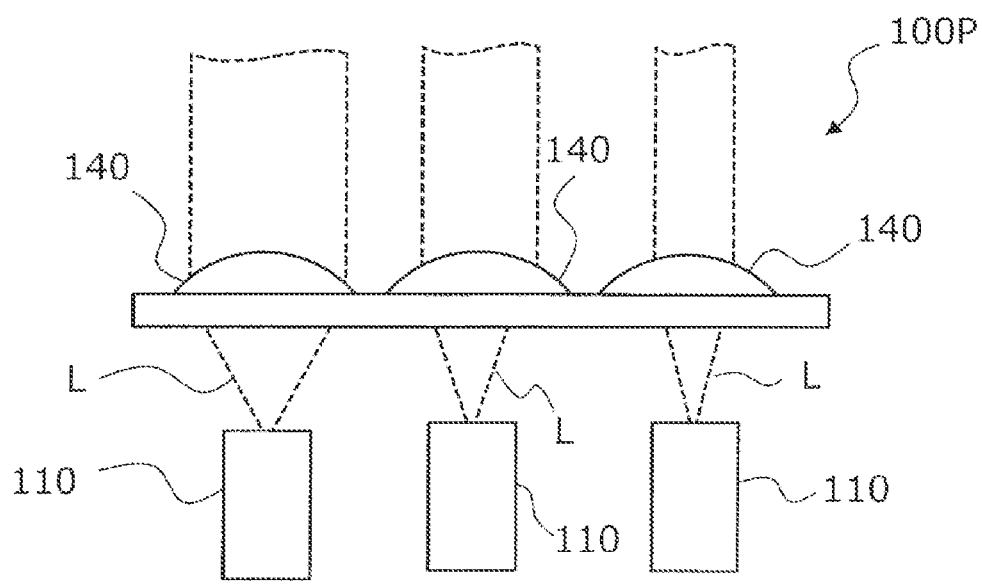
FIG. 2 is a diagram schematically illustrating a plurality of light emitting elements emitting light with different diverging angles in a light emitting device that does not have a sub-lens.

With reference to FIG. 1 and FIG. 2, difficulties that may occur in a light emitting device configured to collimate or diverge light emitted from a plurality of light emitting elements by using a plurality of lenses will be described.

FIG. 1 is a diagram schematically showing a configuration of a light emitting device 100P having a plurality of laser diodes 110 and a plurality of lenses 140. The light emitting device 100P does not have sub-lenses, such that light L emitted from each of the laser diodes 110 reaches a corresponding one of the lenses 140. The lenses 140 employed in this example are optical elements configured to collimate light L emitted from a corresponding one of the laser diodes 110. In this case, the light emitting device 100P is designed to collimate the light from each lens 140 into a substantially parallel beam shape. Therefore, the design position and orientation of each laser diode 110 is determined such that the "light emitting region" at the emission edge of each of laser diode 110 is aligned with or near the focal point of the lens 140 and the center portion of the light L perpendicular to the light incidence surface of lens 140. The light-emitting region of a laser diode is also referred to as the emitter region. In the description below, the design position of the light emitting region may be referred to as the target position. The target position of the light-emitting region of each laser diode 110 does not necessarily have to be exactly the same as the focal point of lens 140, and can be determined to form a desired light beam. For example, to control the beam shape of collimated light L, a target position may be intentionally set to slightly away from the focal point and place the light emitting region at that target position. In such a case, it is necessary to accurately position the light emitting region of the laser diode 110 at the design position, that is, the target position determined based on the optical design.

When mounting the laser diode 110, the position of laser diode 110 may deviate from the target position. Such a positional deviation can be caused by variations in the mounting of the laser diode 110. If the laser diode 110 deviates from its design position, such as the light emitting region offset from the target position, the direction and/or diverging angle of light passing through the lens 140 may deviate from the designed range. In the example shown in FIG. 1, the light-emitting region of each laser diode 110 is out of the target position, by which the light beam passing through the lens 140 is not collimated as designed, and the direction and diverging angle of the light beam are out of the target.

The positional deviation of the laser diodes 110 can occur separately at each laser diode 110. After mounting the laser diodes 110, if the position or orientation of individual lenses 140 can be adjusted to match the position of the light emitting region, desired collimation light can be obtained. However, if each lens 140 is secured to a common member or formed from the same material monolithically, such individual adjustments cannot be performed. Also, if the lenses 140 are secured on the light-transmissive member of the package, a smaller range is allowed for adjusting each lens 140, so the alignment of individual lens 140 may not be able to compensate for the positional deviation of the light emission area.

FIG. 2 is a diagram schematically illustrating a plurality of laser diodes 110 in the light emitting device 100P emitting light L with different diverging angles. As in the example illustrated in FIG. 1, the light emitting device 100P illustrated in FIG. 2 does not have a sub-lens. The laser diodes 110 emit light L with uneven diverging angles, for example, when the laser diodes 110 emit light of different colors. In such a case, the structures and sizes of the laser diodes 110 may differ from one another, and accordingly, the diverging angles of the emitted light may from one another. In such a case, the beam diameters of the light beam passing through the lenses 140 may differ from one another. In order to obtain collimated lights of closely uniform beam diameters by changing the focal distances of the lens 140 according to the types of laser diodes 110, the size of the light emitting device 100P along the optical axis must be increased.

Such concerns may occur not only when various types of laser diodes 110 are combined with lenses, but also when various types of light emitting elements are combined with lenses.

Basic Configuration

Figure 3:
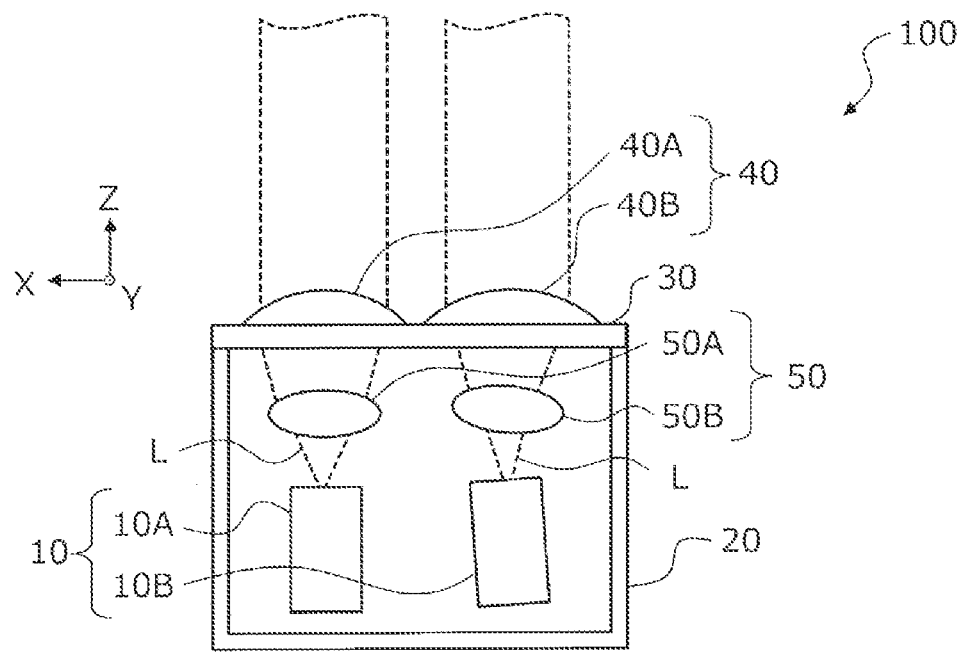
FIG. 3 is a diagram schematically showing a basic configuration of a light emitting device according to one embodiment of the present disclosure.

Certain embodiments of the present disclosure will be described below with reference to the drawings. An example of a basic configuration of a light emitting device common to certain embodiments will be described with reference to FIG. 3. FIG. 3 is a diagram schematically showing an example of a configuration of a light emitting device. In certain drawings, an X-axis, a Y-axis, and a Z-axis that are orthogonal to one another are schematically shown for reference. The orientation of the light emitting device during use is arbitrary and is not limited by the orientation of the light emitting device shown in the drawings.

The light emitting device 100 includes a plurality of light emitting elements 10, including a first light emitting element 10A and a second light emitting element 10B, and a case 20, which encloses the plurality of light emitting elements 10. The plurality of light emitting elements 10 may be hermetically sealed by the case 20. Although two light emitting elements 10 are illustrated in FIG. 3, the number of the light emitting elements 10 may be three or more, as shown in other examples illustrated below. The light emitting elements 10 may be laser elements, such as edge-emitting semiconductor laser elements or vertical cavity surface emitting laser (VCSEL) elements. For such laser elements, laser diodes (LDs) having semiconductor layers can be used. Light emitting elements 10 may be light emitting light emitting diodes (LEDs) configured to emit incoherent light. The light emitting elements 10 are preferably laser elements, because a laser light emitted from a laser element has higher rectilinear propagation than light emitted from an LED, allowing more light to be irradiated into the lens. The term "light-emitting region" of each of the light emitting element 10 refers to a region in a surface of each of the light emitting elements 10 from where light L is emitted. When the light emitting elements 10 are laser elements, the term "light-emitting region" of each of the light emitting elements 10 refers to a region in a surface of each of the light emitting elements 10 from where a laser beam is emitted. The light emitted from each of the light emitting elements 10 is visible light, for example. The wavelength of the light is not limited to the visible light range, but can be in the infrared or ultraviolet range. In addition, the plurality of light emitting elements 10 may respectively emit light in different wavelength ranges or may respectively emit light of different colors. In the example shown in FIG. 3, the peak wavelength of the light emitted from the first light emitting element 10A is different from the peak wavelength of the light emitted from the second light emitting element 10B.

The case 20 has a light-transmissive region 30 to allow the light L emitted from the plurality of light emitting elements 10 to pass therethrough. The light-transmissive region 30 is, for example, formed with glass. The case 20 may be referred to as a package. A specific example of the configuration of the case 20 will be described below.

The light emitting device 100 has a plurality of main lenses 40 respectively covering at least portions of the light-transmissive region 30. The plurality of main lenses 40 include a first main lens 40A configured to collimate or converge the light L emitted from the first light emitting element 10A, and a second main lens 40B configured to collimate or converge the light L emitted from the second light emitting element 10B. In the example shown in FIG. 3, the main lenses 40 are collimating lenses.

Further, the light emitting device 100 has a plurality of sub-lenses 50 disposed in the interior of the case 20. The plurality of sub-lenses 50 include a first sub-lens 50A disposed in an optical path between the first light emitting element 10A and the first main lens 40A, and a second sub-lens 50B disposed in an optical path between the second light emitting element 10B and the second main lens 40B. Accordingly, the light emitted from the first light emitting element 10A passes through the first sub-lens 50A and enters the first main lens 40A. The first sub-lens 50A provides an auxiliary function of the first main lens 40A. The first main lens 40A in combination with the first sub-lens 50A can achieve a desired collimation or conversion. Similarly, the light emitted from the second light emitting element 10B passes through the second sub-lens 50B and enters the second main lens 40B. The second sub-lens 50B provides an auxiliary function of the second main lens 40B. The second main lens 40B in combination with the second sub-lens 50B can achieve a desired collimation or conversion. Accordingly, the main lenses 40 used in combination with the sub-lenses 50 may have a shape different from that of the main lenses used without the sub-lenses 50.

In FIG. 3, light L emitted from each of the light emitting element is represented graphically by the area enclosed by two dashed lines. The intensity of light L, such as a laser beam, can be approximately represented as, for example, a Gaussian distribution at a plane perpendicular to the direction of propagation of the center of the light L. The diameter of the beam of such light L can be determined by the size of the region with the light intensity, for example, equal or greater than $1/e^2$, relative to the light intensity of the center of the beam, where "e" is Napier's constant (about 2.71). The diameter of the beam may be defined by other criteria.

The plurality of sub-lenses 50 can be disposed independently of each other in the case 20. Therefore, the position and orientation of the individual sub-lenses 50 can be adjusted without being constrained to each other. In FIG. 3, components supporting the sub-lenses 50 are not shown for simplicity. The individual sub-lenses 50 can be secured directly or indirectly to the case 20.

The position and orientation of the first sub-lens 50A are determined according to the position and orientation of the first light-emitting element 10A after the first light emitting element 10A is disposed in the case 20. Similarly, the position and orientation of the second sub-lens 50B are determined according to the position and orientation of the second light-emitting element 10B after the second light emitting element 10B is disposed in the case 20. The plurality of sub-lenses 50 can each compensate positional deviation and/or orientation deviation of the plurality of light emitting elements 10. Also, even when the plurality of light emitting elements 10 are disposed without positional deviation, differences in the beam diameters or in the conversion point of the light may occur due to differences in the properties such as wavelengths and diverging angles of light emitted from the plurality of light emitting element 10. Such differences in the beam diameter or in the conversion point of light emitted from each of the plurality of light emitting elements 10 can be adjusted by a respective corresponding one of the plurality of sub-lenses 50. From these features, the sub-lenses 50 may be referred to as correcting lenses or adjusting lenses.

Adjustment of the position and orientation of each of the sub-lenses 50 can be performed by measuring light L passing through the sub-lens 50 by using a device such as a beam profiler, while maintaining emission of light L from the light emitting element 10. For example, when an ultraviolet curable resin is used to secure the sub-lenses 50 to the case 20, the adjustment described above is carried out with the uncured ultraviolet curable resin between the sub-lenses 50 and the case 20. After determining the position and orientation of the sub-lenses 50, the resin can be cured by irradiating ultraviolet light to the resin while maintaining the positions and orientations of the sub-lenses 50 by using a jig or a holding device. Instead of using the resin, a bonding material containing a metal that is softened or melted by heating may be used. Adjusting the direction and/or diverging angle of light L emitted from the light emitting device 100 by disposing the sub-lenses 50 while maintaining emission of light L from the light emitting elements 10 can be referred to as "active alignment." After such active alignment is completed, the main lenses 40 are disposed.

Lights L that have been corrected through the sub-lenses 50 enter the main lenses 40 respectively. This allows the lights passed through the main lenses 40 to be within the target quality range. The quality of light includes propagating direction of light, diverging angle of light, and intensity of light. The expression "within the target quality" means one or more of these are within the target range, and it is preferable that all of them are within the target range.

In addition, even if the main lenses 40 are provided as a lens array in which the main lenses 40 are connected to one other, it is possible to obtain a plurality of light beams each satisfying the desired quality, by adjusting the position of the lens array within a range that is allowed for the lens array.

In FIG. 3, the main lenses 40 are secured directly or indirectly to an outside of the case 20. If the main lenses 40 are disposed to the interior of the case 20, the light collimated or converged by the main lenses 40 are extracted to the outside of the case 20 through the light-transmissive region 30. In such a case, the possibility of degradation in the quality of the light beam caused by the light-transmissive region 30 cannot be ruled out. Therefore, it is preferable to dispose the main lenses 40 outside of the case 20 as shown in FIG. 3. With this arrangement, degradation in the quality of the light beams can be reduced or avoided. Meanwhile, the sub-lenses 50 are disposed to the interior of the case 20, not to the outside. The light L emitted from each of the light emitting elements 10 spreads in a wider range as the distance from the light emitting region increases. By disposing the sub-lenses 50 inside the case 20, the sub-lenses 50 can be placed closer to the light-emitting regions of the light emitting elements 10, which allows the correction by the sub-lenses 50 having dimensions smaller than that required for the sub-lenses 50 placed outside of the case 20. This can be advantageous for miniaturizing the light emitting device 100.

First Embodiment

A first embodiment will be described below with reference to FIG. 4A through FIG. 8.

A general structure of a light emitting device 100 according to the first embodiment will be described below with reference to FIG. 4A, FIG. 4B, FIG. 5A, FIG. 5B, and FIG.

Figure 4A:
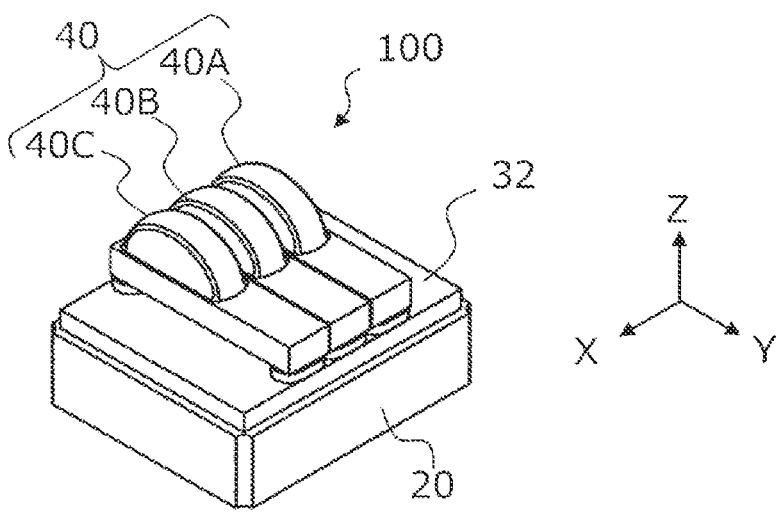
FIG. 4A is a schematic perspective view of a light emitting device according to a first embodiment of the present disclosure.
Figure 4B:
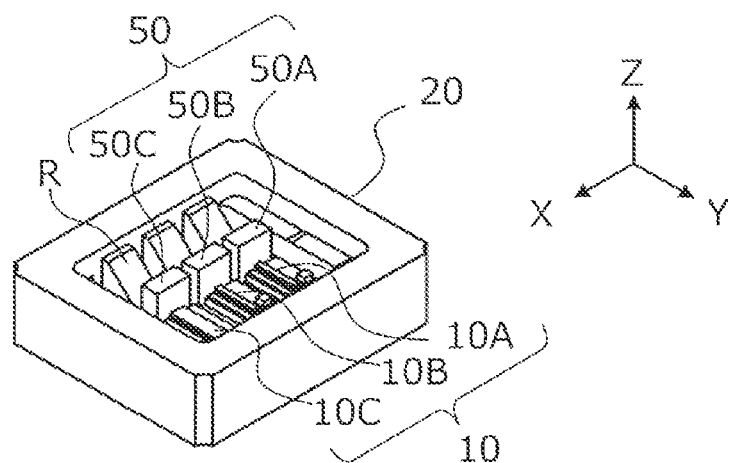
FIG. 4B is a schematic perspective view showing an interior of a light emitting device according to the first embodiment.
Figure 5A:
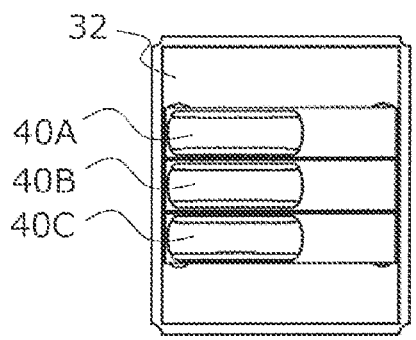
FIG. 5A is a schematic top view of a light emitting device according to the first embodiment, viewed from the positive side of the Z-axis.
Figure 5B:
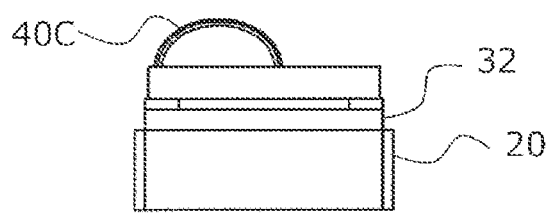
FIG. 5B is a schematic side view of the light emitting device according to the first embodiment, viewed from the positive side of the X-axis.
Figure 5C:
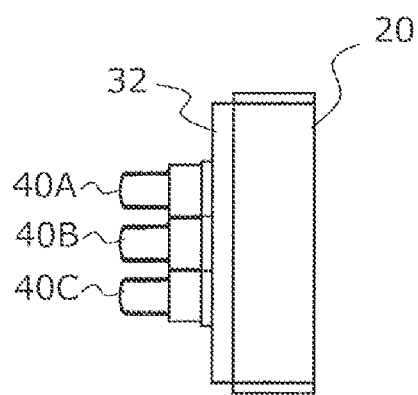
FIG. 5C is a schematic side view of the light emitting device according to the first embodiment, viewed from the positive side of the Y-axis.

5C. FIG. 4A is a schematic perspective view of a light emitting device according to the first embodiment. FIG. 4B is a schematic perspective view showing an interior of the light emitting device 100 according to the first embodiment. FIG. 5A is a schematic top view of a light emitting device 100 according to the first embodiment, viewed from the positive side of the Z-axis. FIG. 5B is a schematic side view of the light emitting device 100 according to the first embodiment, viewed from the positive side of the X-axis. FIG. 5C is a schematic side view of the light emitting device 100 according to the first embodiment, viewed from the positive side of the Y-axis.

The light emitting device 100 according to the first embodiment includes a plurality of light emitting elements 10 including a first light emitting element 10A, a second light emitting element 10B, and a third light emitting element 10C, and a case 20 that encloses the plurality of light emitting elements 10.

In the example placement shown in FIG. 4B, each of the light emitting elements 10A, 10B, and 10C emits light in the negative direction of the Y-axis. Three reflectors R are disposed in the interior of the case 20, each configured to reflect the light emitted from a corresponding one of the three light emitting elements 10 in the positive direction of the Z-axis. Also, as shown in FIG. 4A, the case 20 has a cover 32 including a light-transmissive region that allows light reflected by the reflector R passes therethrough. In this example, the entire cover 32 is formed from a light-transmissive material and serves as the light-transmissive region. Instead of the entire part of the cover 32, a portion of the cover 32 may serve as a light-transmissive region. The light emitting device 100 includes a plurality of main lenses 40: a first main lens 40A, a second main lens 40B, and a third main lens 40C, covering at least portions of the cover 32, and a plurality of sub-lenses 50 disposed in the interior of the case 20: a first sub-lens 50A, a second sub-lens 50B and a third sub-lens 50C. In this example, each of the plurality of sub-lenses 50 is disposed between a corresponding one of the plurality of light emitting elements 10 and a corresponding one of the plurality of reflectors R.

Figure 6:
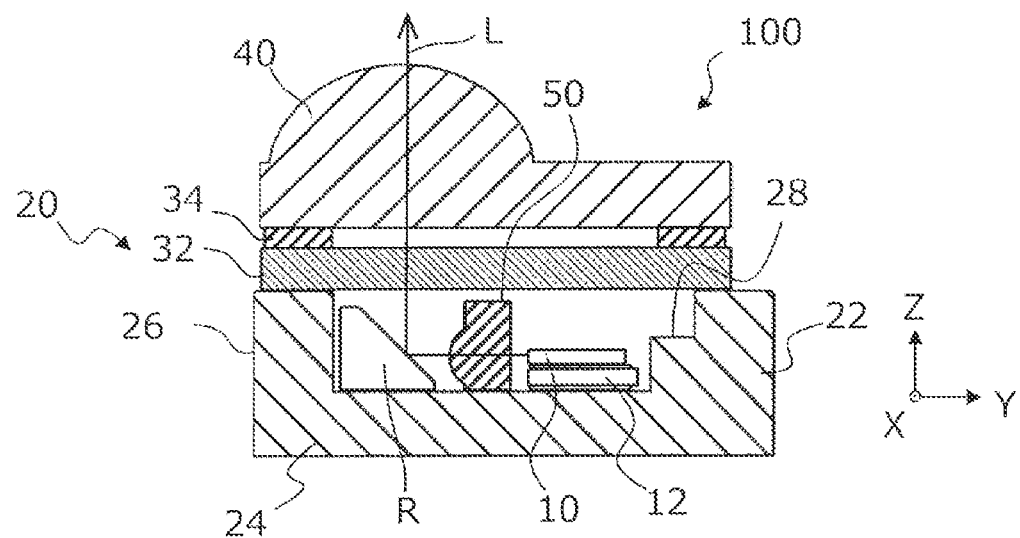
FIG. 6 is a schematic cross-sectional view of a light emitting device according to the first embodiment.
Figure 7:
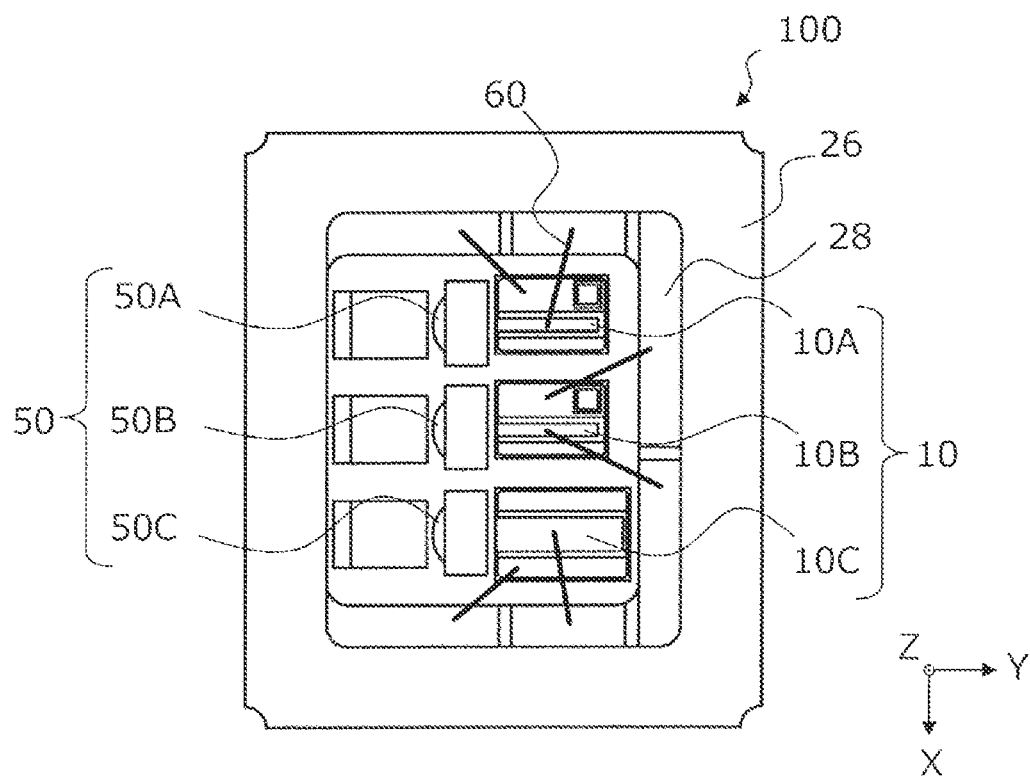
FIG. 7 is a schematic plan view showing an internal configuration of a light emitting device according to the first embodiment.
Figure 8:
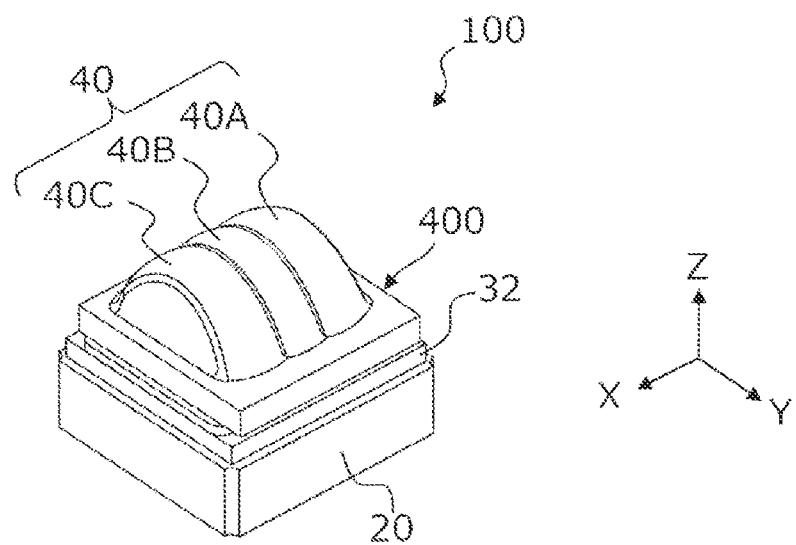
FIG. 8 is a schematic perspective view showing an example of a lens array that can be used in the light emitting device according to the first embodiment.

Next, with reference to FIG. 6, FIG. 7 and FIG. 8, the configuration of the light emitting device 100 according to the first embodiment will be described in detail. FIG. 6 is a schematic cross-sectional view of the light emitting device 100 according to the first embodiment. FIG. 7 is a schematic plan view showing the internal configuration of the light emitting device 100, in which the cover 32 and the main lenses 40 are not shown. FIG. 8 is a schematic perspective view showing a configuration example of a lens array 400 that can be used in the light emitting device 100.

As shown in FIG. 6, case 20 of light emitting device 100 has a base 22 supporting light emitting element 10 and a cover 32 covering light emitting element 10. The cover 32 can be formed from a light-transmissive material such as sapphire. The cover 32 includes, for example, a plate formed from a light-transmissive material. A metal layer may be disposed on a surface of the plate. The base 22 includes a bottom portion 24 having a first upward-facing surface on which a plurality of light emitting elements 10 are disposed, and a frame portion 26 surrounding the plurality of light emitting elements 10 and having a second upward-facing surface. The main lenses 40 are disposed on the cover 32 and the cover 32 is supported by the second upward-facing surface of the frame portion 26.

The base 22 includes an electrode structure to electrically connect the light emitting elements 10 to an external power source. The plurality of light emitting elements 10 are electrically connected to the electrode structure. Therefore, the base 22 also serves to electrically connect the light emitting elements 10 to the external power supply. The base 22 can be formed from a composite of an electrically insulating material and an electrically conductive material. The base 22 includes, for example, an electrically insulating ceramic body and an electrically conductive metal part that serves as electrodes.

In the example shown in FIG. 6, the frame portion 26 has a step portion having a third upward-facing surface 28 between the second upward-facing surface supporting the cover 32 and the first upward-facing surface of the bottom portion 24. At least portions of the electrode structure for connecting the light emitting elements 10 to the external power supply can be disposed on the third upward-facing surface 28 of the step portion. A portion of the electrode structure can be a via electrode that penetrates the base 22. The electrode structure and the light emitting elements 10 can be electrically connected, for example, via respective wires. In FIG. 6, the wires are not shown. In FIG. 7, six wires 60 are schematically illustrated. The wires 60 electrically connect the electrically conductive layers that are parts of the electrode structure disposed on the third upward-facing surface 28 of the step portion and the light emitting elements 10 respectively. In FIG. 7, the wires 60 are shown in the shape of straight lines, but the wires 60 may have, for example, curved portion(s) or bent portion(s).

In the example shown in FIG. 6, each of the light emitting elements 10 is secured to a corresponding one of the sub-mounts 12, and the sub-mounts 12 are secured to the base 22. The sub-mounts 12 can be omitted from the configuration of the light emitting device 100. The sub-mounts 12 can be formed from a material having a thermal conductivity higher than the thermal conductivity of the base 22 to increase heat dissipation. The light-emitting region of each of the light emitting elements 10 is located opposite to the corresponding reflector R such that the light L is emitted toward the reflector R. In FIG. 6, an optical axis (center) of light L is schematically depicted as a straight arrow. A plurality of sub-lenses 50 are disposed between the light-emitting regions of the light emitting elements 10 and the reflectors R, respectively. The positions of the sub-lenses 50 are adjusted to compensate for positional deviations of corresponding one of the light emitting elements 10, and then the sub-lenses 50 are secured to the base 22. The expression "compensation" shown above does not necessarily mean strict matching of the focal point of the lens system formed by a combination of one of the main lenses 40 and a corresponding one of the sub-lenses 50 onto the light-emitting region of a corresponding one of the light emitting elements 10. "Compensation" includes adjusting the position and/or orientation of the sub-lens 50 such that the focal point of the lens system is brought relatively close to the light-emitting region of the light emitting element 10 compared to that without the sub-lenses 50.

The position and orientation of each of the sub-lenses 50 are preferably adjusted such that the focal point of the lens system formed by a combination of one of the main lenses 40 and a corresponding one of the sub-lenses 50 matches the light-emitting region of the light emitting element 10. This allows each portion of light L that has passed through the corresponding one of the sub-lenses 50 to be more reliably collimated or converged by the corresponding one of the main lenses 40. It is also preferable that at least one of the main lenses 40 and the sub-lenses 50 is not a lens array with a plurality of lenses mechanically connected together, but that the lenses are separate lens components. This allows for a wider adjustment range for the focal point of each combination of the main lens 40 and the sub-lens 50, compared to a case in which both the main lenses 40 and the sub-lenses 50 are respectively provided as lens arrays. Accordingly, the focal point can be easily matched to the light emitting region of a corresponding one of the light emitting elements 10.

Each of the reflectors R has a light-reflecting surface on at least one side. The light-reflecting surface is inclined with respect to the bottom surface of the reflector R to reflect light L from the light emitting element 10 toward the light-transmissive region. The reflector R receives the radiation light from the light emitting element 10, therefore preferably be formed from a heat-resistant material. The light-reflecting surface can be formed with a layer of a material having high reflectance. The main body part of the reflector R can be formed from glass such as quartz or BK7 (borosilicate glass), a metal such as aluminum, or Si. The light-reflecting surface can be formed from a metal layer and/or a dielectric multilayer film.

It is preferable that a portion of each of the sub-lenses 50 has a shape that allows bonding to the base 22, for example, a rectangular parallelepiped shape. Each of the sub-lenses 50 has a curved-surface lens portion. This curved surface can be convex or concave. The sub-lenses 50 can be made of, for example, glass such as BK7 or B270. The main lenses 40 can also be made of, for example, glass such as BK7 or B270. The main lens 40 contains three main lenses 40A, 40B and 40C arranged in an X axis direction as shown in FIG. 4A. Each of the main lenses 40A, 40B, and 40C has a spherical or an aspherical lens shape at a portion where light L passes through, and has appropriate shapes at other portions. In the example shown in FIG. 4A, the lens shape portion of each of the main lenses 40 is a convex portion protruding upward from a plate-like portion. Close arrangement of the convex portions of the plurality of main lenses 40 can facilitate miniaturization of the light emitting device 100. The distance between each of the convex portions of the plurality of main lenses 40 can be, for example, smaller than the width in the X-axis direction of a single convex portion.

The main lenses 40A, 40B, and 40C may be bonded to the cover 32 as separate lens components, or may be secured to the cover 32 as a single integrated lens array. FIG. 8 is a schematic perspective view showing a configuration example of a lens array 400 in which the main lenses 40A, 40B, and 40C are connected to each other. The lens array 400 is a one-piece body with the main lenses 40A, 40B, and 40C in a tightly aligned structure along the X-axis. There may be a gap between the first main lens 40A and the second main lens 40B, and between the second main lens 40B and the third main lens 40C, or the three main lenses 40A, 40B, and 40C may be connected without a gap.

As shown in FIG. 6, the main lenses 40 can be secured to the cover 32 via a bonding layer 34. The bonding layer 34 can be formed from ultraviolet curable resin, for example. The lens array 400 shown in FIG. 8 can also be secured to the cover 32 via a similar bonding layer. In the lens array 400, the relative positional relationship among the main lenses 40A, 40B, and 40C are in a fixed state, such that the main lenses 40A, 40B, and 40C are not required to be secured separately to the cover 32. The lens array 400 can be handled as a single component and thus can facilitate mounting.

The plurality of light emitting elements 10 may emit light of different colors. For example, light emitting elements 10 respectively emitting light of blue color, green color, and red color can be employed. In the first embodiment, the first light emitting element 10A, the second light emitting element 10B, and the third light emitting element 10C can be respectively a green semiconductor laser element to emit a green laser beam, a blue semiconductor laser element to emit a blue laser beam, and a red semiconductor laser element to emit a red laser beam. All of them are edge-emitting semiconductor laser elements.

The peak wavelength of the laser beam emitted by the blue semiconductor laser element is in a range of 430 to 480 nm and may be in a range of 450 to 470 nm. The peak wavelength of the laser beam emitted by the green semiconductor laser element is in a range of 500 to 550 nm and may be in a range of 520 to 540 nm. The peak wavelength of the laser beam emitted by the red semiconductor laser element is in a range of 620 to 660 nm and may be in a range of 630 to 650 nm. The blue semiconductor laser element and the green semiconductor laser element can be formed mainly from nitride semiconductors. Examples of nitride semiconductors include GaN, InGaN, and AlGaN. The red semiconductor laser element can be formed mainly of a gallium arsenic-based semiconductor. When laser elements are employed as the light emitting elements 10, the higher the optical energy is, the more accumulation of dust etc., from the environmental atmosphere attracted on the light-emitting surfaces of the laser elements in operation. Dust and other particles on the light-emitting surface can reduce the optical output. The optical energy increases with shorter wavelengths of the laser beam, and with higher optical output. For this reason, when laser elements to emit laser beams of green color or shorter wavelengths are employed as the light emitting elements 10, the light emitting elements 10 are preferably hermetically sealed within the case 20. When the light emitting elements 10 are hermetically sealed within the case 20, outside dust etc., can be prevented from entering the case 20, such that possibility of dust etc., attaching to the light emitting surfaces of the laser elements can be reduced.

Lasing performance fluctuation due to temperature may more likely occur in red semiconductor laser elements than in blue and green semiconductor laser elements. Blue semiconductor laser elements have a power conversion efficiency greater than that of green semiconductor laser elements, and thus the amount of heat generated from the blue semiconductor laser elements is smaller than that from the green semiconductor laser elements. For this reason, the green semiconductor laser elements are preferably disposed spaced apart from the red semiconductor laser elements. As shown in FIG. 7, in the first embodiment, the blue semiconductor laser element (a second light emitting element 10B) is disposed between the red semiconductor laser element (a third light emitting element 10C) and the green semiconductor laser element (a first light emitting element 10A). With this configuration, the emission characteristics of the red semiconductor laser element (the third light emitting element 10C) can be stabilized.

One or more semiconductor elements other than the light emitting elements 10 may be disposed in the case 20. For example, a protective circuit element such as a Zener diode configured to control reverse voltage loaded on respective light emitting elements 10 within a predetermined level and/or a photodetection element such as a photodiode configured to monitor the intensity of light L may also be disposed.

In the first embodiment, each of the sub-lenses 50 can be disposed close to the light-emitting region of a corresponding one of the light emitting elements 10, such that light L emitted from each of the light-emitting regions enters the sub-lens 50 before expanding. This allows for reducing the size of the sub-lenses 50. Further, adjusting the positions of the sub-lenses 50 within the case 20 allows for compensating for positional deviation of the light-emitting regions. Other than that shown in the figures, the shapes and dimensions of the sub-lenses 50 can be appropriately determined. In addition, when the beam sizes of light L emitted from the plurality of light emitting elements 10 at the light incidence surfaces of the main lenses 40 differ without the sub-lenses 50, it is possible to adjust the beam size of each portion of light L to approach uniformity by using the sub-lenses 50.

Second Embodiment

A second embodiment of the present invention will be described below with reference to FIG. 9A through FIG. 12.

Figure 9A:
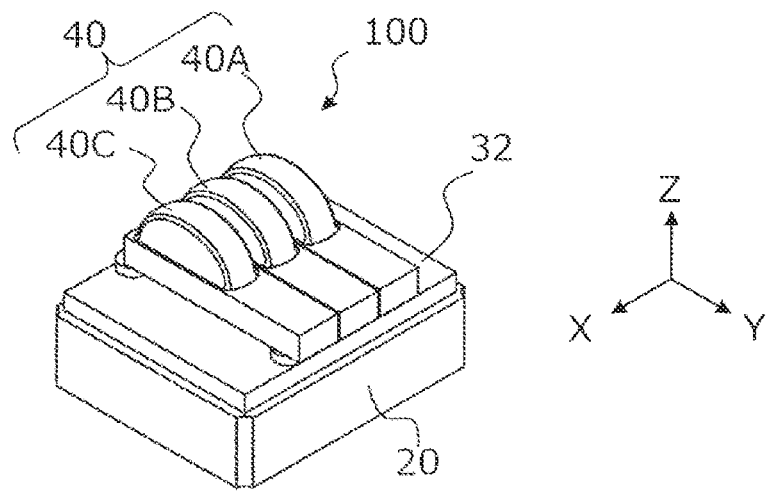
FIG. 9A is a schematic perspective view of a light emitting device according to a second embodiment of the present disclosure.
Figure 9B:
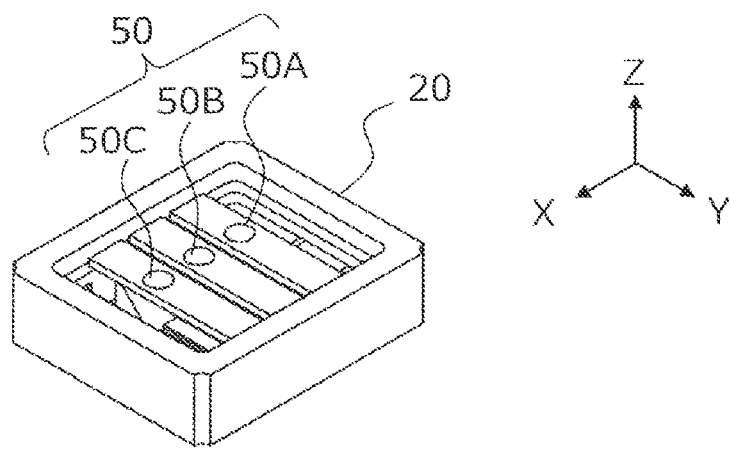
FIG. 9B is a schematic perspective view showing an interior of a light emitting device according to the second embodiment.
Figure 10A:
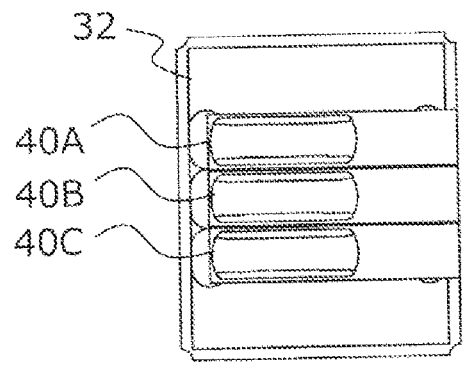
FIG. 10A is a schematic top view of a light emitting device according to the second embodiment, viewed from the positive side of the Z-axis.
Figure 10B:
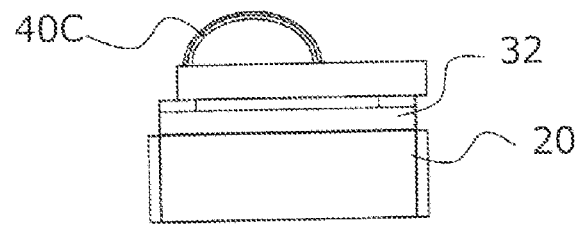
FIG. 10B is a schematic side view of the light emitting device according to the second embodiment, viewed from the positive side of the X-axis.
Figure 10C:
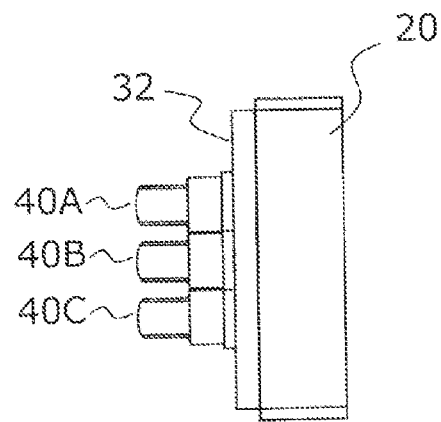
FIG. 10C is a schematic side view of the light emitting device according to the second embodiment, viewed from the positive side of the Y-axis.

A schematic configuration of a light emitting device 100 according to the second embodiment will be described below with reference to FIG. 9A, FIG. 9B, FIG. 10A, FIG. 10B, and FIG. 10C. FIG. 9A is a schematic perspective view of a light emitting device according to the second embodiment. FIG. 9B is a schematic perspective view showing an interior of the light emitting device according to the second embodiment. FIG. 10A is a schematic top view of the light emitting device shown in FIG. 9A, viewed from the positive side of the Z-axis. FIG. 10B is a schematic lateral view of the light emitting device shown in FIG. 9A, viewed from the positive side of the X-axis. FIG. 10C is a schematic lateral view of the light emitting device shown in FIG. 9A, viewed from the positive side of the Y-axis.

As in the light emitting device 100 according to the first embodiment described above, the light emitting device 100 according to the second embodiment includes a plurality of light emitting elements 10 that includes a first light emitting element 10A, a second light emitting element 10B, and a third light emitting element 10C, a case 20 enclosing the plurality of light emitting elements 10. The difference from the first embodiment is the configuration of a plurality of sub-lenses 50 disposed in the case 20. The difference will be described in detail below.

As shown in FIG. 9B, the light emitting device 100 according to the second embodiment includes a first sub-lens 50A, a sub-lens 50B, and a third sub-lens 50C. In the second embodiment, the plurality of sub-lenses 50 are respectively disposed between the cover 32 and a corresponding one of the reflectors R.

Figure 11:
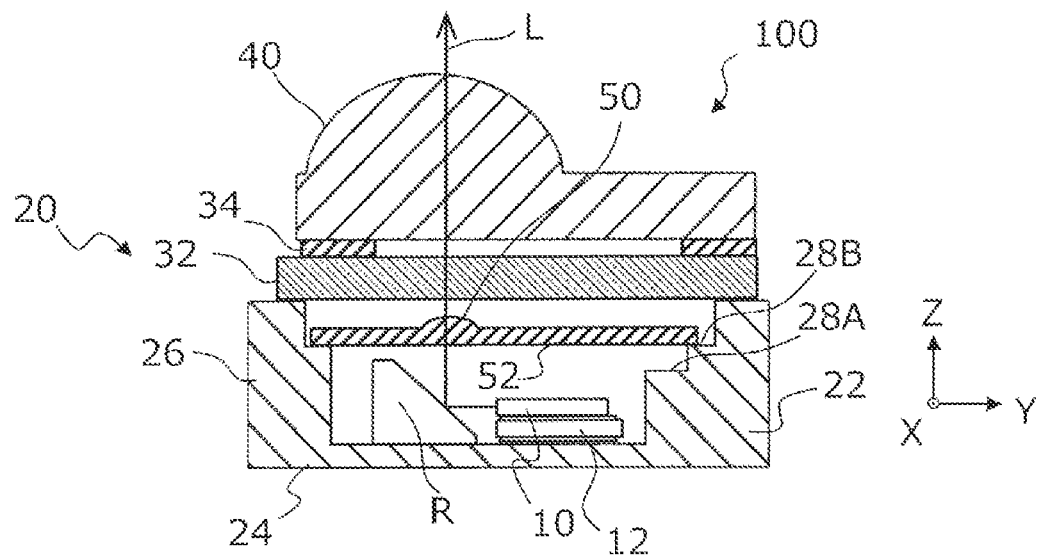
FIG. 11 is a schematic cross-sectional view of the light emitting device shown in FIG. 9A.
Figure 12:
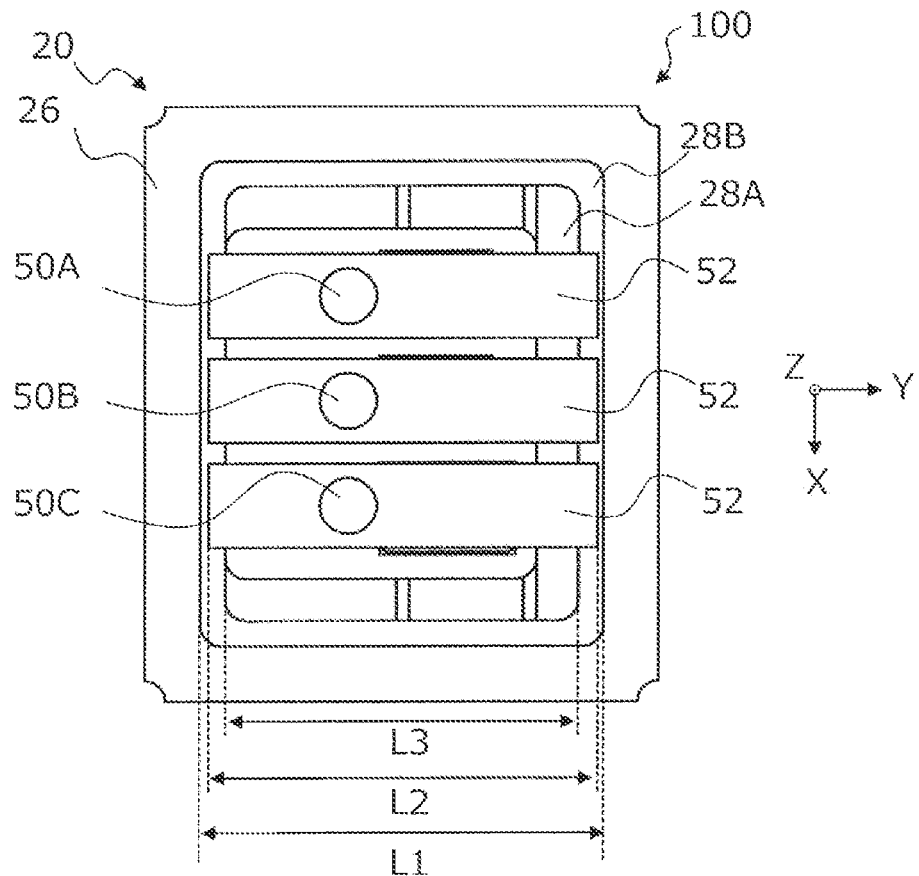
FIG. 12 is a schematic plan view showing an internal configuration of a light emitting device shown in FIG. 9A.

Next, with reference to FIG. 11 and FIG. 12, structure of the sub-lenses 50 of the light emitting device 100 according to the second embodiment will be described. FIG. 11 is a schematic cross-sectional view showing the light emitting device 100 according to the second embodiment. FIG. 12 is a schematic plan view showing a structure of an interior of the light emitting device 100. In FIG. 12, the cover 32 and the main lenses 40 are not shown.

As shown in FIG. 11, the case 20 of the light emitting device 100 in the second embodiment also includes a base 22 configured to support the plurality of light emitting elements 10, and a cover 32 configured to cover the plurality of light emitting elements 10. The base 22 includes a bottom portion 24 having a first upward-facing surface on which a plurality of light emitting elements 10 and a plurality of reflectors R are disposed, and a frame portion 26 surrounding the plurality of light emitting elements 10 and having a second upward-facing surface. The light emitting elements 10 are surrounded by the frame portion 26. The main lenses 40 are disposed on the cover 32 and the cover 32 is supported by the second upward-facing surface of the frame portion 26. The main lenses 40 may be provided as the lens array 400 shown in FIG. 8.

In the example shown in FIG. 11, the frame portion 26 has two step portions (an upper step portion and a lower step portion) respectively having an upward-facing surface between the second upward-facing surface supporting the cover 32 and the first upward-facing surface of the bottom portion 24. At least a portion of the electrode structure to connect the light emitting elements 10 to an external power source can be disposed on the upward-facing surface 28A of the lower step portion. In the second embodiment, each of the plurality of sub-lenses 50 is supported by the upward-facing surface 28B of the upper step portion of the frame portion 26.

In FIG. 11 and FIG. 12, the wires are not shown. The light emitting device 100 according to the second embodiment also includes the electrode structure and wires as described in the first embodiment, and the repetitive description of which will be omitted.

As shown in FIG. 12, each of the sub-lenses 50A, 50B, and 50C has a plate-like flat extending portion 52 and a lens shape having convex portion with a curved surface. The convex portion serves as a lens. The sub-lenses 50A, 50B, and 50C are respectively discrete components and, for example, made of a glass material. Each of the sub-lenses 50A, 50B, and 50C has a substantially rectangular shape in a plan view, with a length L1 in a Y-axis direction that allows each of the sub-lens 50A, 50B, and 50C to rest on the left portion and the right portion of the upward-facing surface 28B of the frame portion 26. Both ends of each of the sub-lenses 50A, 50B, and 50C are slidably supported by the upward-facing surface 28B of the frame portion 26 and can be slid in an X-axis direction before being secured to the frame portion 26. Before being secured to the frame portion 26, each of the sub-lenses 50A, 50B, and 50C can also be slid in a Y-axis direction. In order to allow such sliding in the Y-axis direction, the length L1 in a Y-axis direction of lateral surfaces extending from outer edges of the upward-facing surface 28B in a positive Z-axis direction is greater than the length L2 of each of the sub-lenses 50A, 50B, and 50C. The length L1 may also be referred to a distance between the left end of the left side portion of the upward-facing surface 28B and the right end of the right side portion of the upward-facing surface 28B in the Y-axis direction. A difference in the lengths (L1−L2) determines an upper limit of shiftable range of the sub-lenses 50A, 50B, and 50C in the Y-axis direction. The difference in the lengths (L1−L2) can be set within a range appropriate for the dimensions of the light emitting device 100. The length L2 may be set, for example, in a range of 0.5 to 0.95 times with respect to the length L1. The difference in the lengths (L1−L2) can be set, for example, within a range of 0.2 to 3 mm. In order to allow the upward-facing surface 28B to support the both ends of the sub-lenses 50A, 50B, and 50C, the length L3 in the Y-axis direction of lateral surfaces extending from inner edges of the upward-facing surface 28B in a negative Z-axis direction is less than the length L2 of each of the sub-lenses 50A, 50B, and 50C. The length L3 may also be referred to a distance between the right end of the left side portion of the upward-facing surface 28B and the left end of the right side portion of the upward-facing surface 28B in the Y-axis direction. The length L3 may be set, for example, in a range of 0.5 to 0.95 times with respect to the length L2. The difference in the lengths (L2−L3) can be set, for example, within a range of 0.02 to 3 mm.

In the second embodiment, at the time of securing the sub-lenses 50A, 50B, and 50C to the frame portion 26, each of the sub-lenses is allowed to be slided in the two dimensions along the upward-facing surface 28B of the step portion, which facilitates the positional adjustment of the sub-lenses 50A, 50B, and 50C.

The positions of the sub-lenses 50A, 50B, and 50C in the Z-axis direction can be adjusted by a thickness of a bonding layer disposed between the upward-facing surface 28B of the step portion and the lower surfaces of the sub-lenses 50A, 50B, and 50C.

As described in the first embodiment, when the sub-lenses 50A, 50B, 50C are secured to the case 20 by using a ultraviolet curable resin, adjustment can be performed with uncured ultraviolet curable resin being disposed between the sub-lenses 50A, 50B, and 50C and the upward-facing surface 28B of the step portion. After the positions and the orientations of the sub-lenses 50A, 50B, and 50C are adjusted, the positions and the orientations of the sub-lenses 50A, 50B, and 50C are held by a jig or a holding device, and ultraviolet light is irradiated to harden the resin.

In the light emitting device 100 according to the second embodiment, the plurality of sub-lenses 50 are respectively held by the step portion of the frame portion 26. This arrangement allows for arranging the sub-lenses 50 at higher locations than the light emitting elements 10 and the reflectors R, which can facilitate handling of the sub-lenses 50A, 50B, and 50C, and which can facilitate positioning of the sub-lenses 50A, 50B, and 50C in X-Y plane. Meanwhile, the shiftable range of the sub-lenses 50A, 50B, and 50C along the propagation direction of light, that is, along the optical axis can be greater in the first embodiment than in the second embodiment. Also, the first embodiment is more advantageous in view of miniaturizing of the light emitting device. This is because in the second embodiment, distances between the light-emitting regions of the light emitting elements 10 and a corresponding one of the sub-lenses 50 becomes relatively great, resulting in relatively large convex portions that serve as lenses in the sub-lenses 50.

In the embodiments described above, the light emitting devices 100 are provided with the reflectors R, but the reflectors R can be optional.

Third Embodiment

A third embodiment of the present invention will be described below with reference to FIG. 13A to FIG. 16. A light emitting device 100 according to the third embodiment is not provided with a reflector R.

Figure 13A:
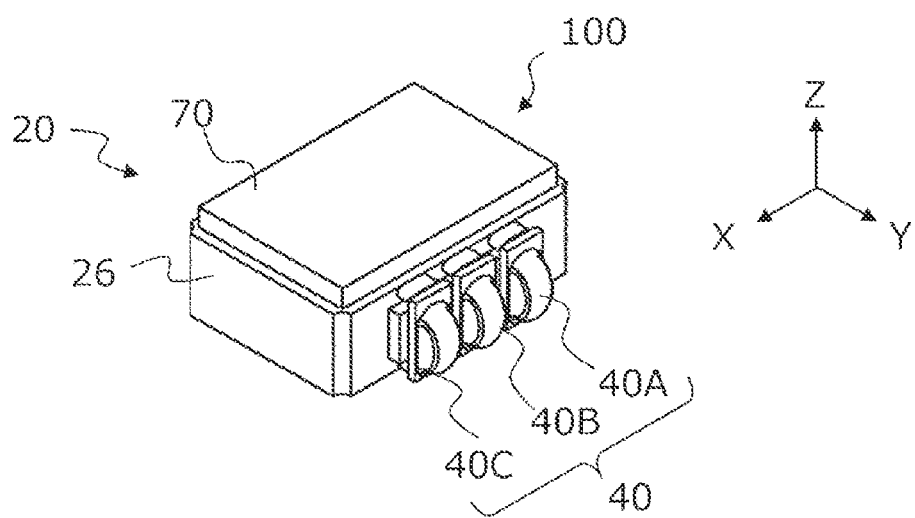
FIG. 13A is a schematic perspective view showing a light emitting device according to a third embodiment of the present disclosure.
Figure 13B:
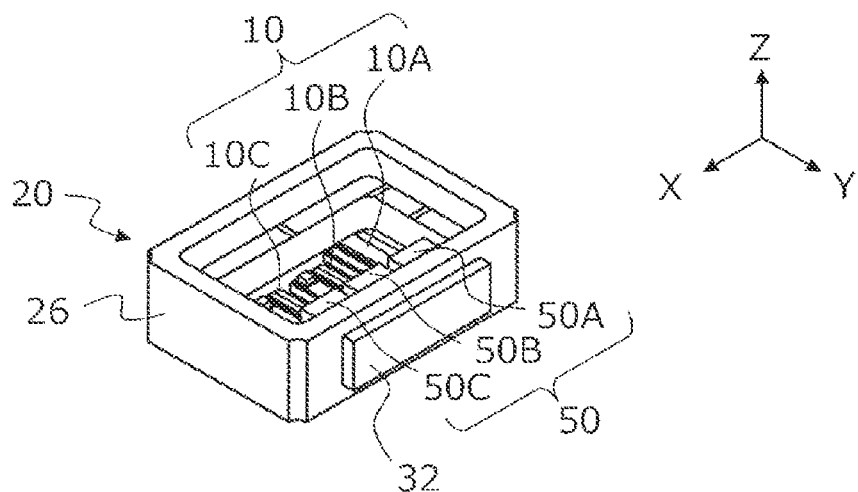
FIG. 13B is a schematic perspective view showing an interior of the light emitting device shown in FIG. 13A.
Figure 14A:
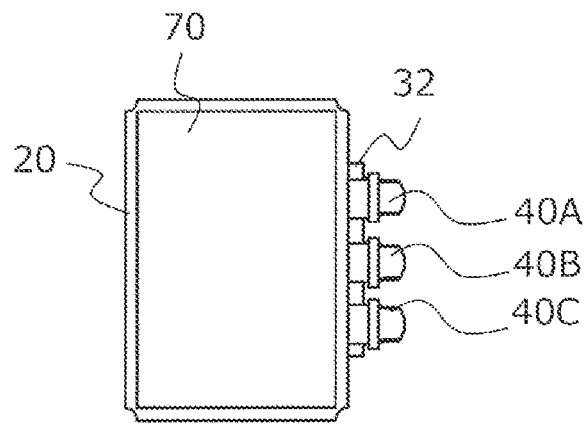
FIG. 14A is a schematic top view of a light emitting device according to the third embodiment, viewed from the positive side of the Z-axis.
Figure 14B:
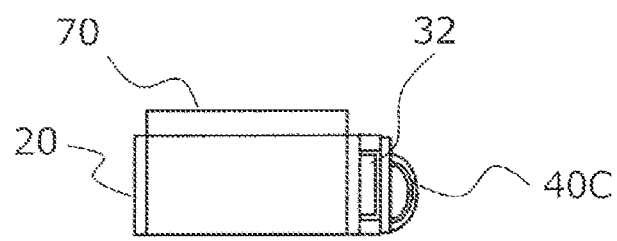
FIG. 14B is a schematic side view of the light emitting device according to the third embodiment, viewed from the positive side of the X-axis.
Figure 14C:
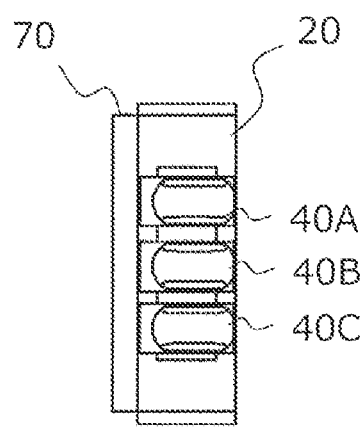
FIG. 14C is a schematic side view of the light emitting device according to the third embodiment, viewed from the positive side of the Y-axis.

A general structure of a light emitting device 100 according to the third embodiment will be described below with reference to FIG. 13A, FIG. 13B, FIG. 14A, FIG. 14B, and FIG. 14C. FIG. 13A is a schematic perspective view showing a light emitting device according to the third embodiment. FIG. 13B is a schematic perspective view showing an interior of the light emitting device according to the third embodiment. FIG. 14A is a schematic top view of and the emitting device according to the third embodiment, viewed from the positive Z-axis. FIG. 14B is a schematic lateral view of the light emitting device according to the third embodiment, viewed from the positive X-axis. FIG. 14C is a schematic lateral view of the light emitting device according to the third embodiment, viewed from the positive Y-axis.

As in the first embodiment and the second embodiment described above, the light emitting device 100 according to the third embodiment includes a plurality of light emitting elements 10, which include a first light emitting element 10A, a second light emitting element 10B, and a third light emitting element 10C, as well as a case 20 enclosing the plurality of light emitting elements 10. The light emitting device 100 according to the third embodiment is not provided with a reflector R. Light emitted from each of the plurality of light emitting elements 10 disposed in the case 20 is extracted from a lateral surface of the case 20. This will be described in detail below. The case 20 has a lid 70 covering a frame portion 26. In FIG. 13B, the lid 70 and main lenses 40 are not shown.

As shown in FIG. 13A, the light emitting device 100 according to the third embodiment includes a first main lens 40A, a second main lens 40B, and a third main lens 40C, respectively secured on a cover 32 located on a lateral surface of the case 20. The light emitting device 100 according to the third embodiment includes a first sub-lens 50A, a sub-lens 50B, and a third sub-lens 50C located in the case 20. In the third embodiment, the first sub-lens 50A is located in the optical path between the first light emitting element 10A and the first main lens 40A. The second sub-lens 50B is located in the optical path between the second light emitting element 10B and the second main lens 40B. The third sub-lens 50C is located in the optical path between the third light emitting element 10C and the third main lens 40C.

Figure 15:
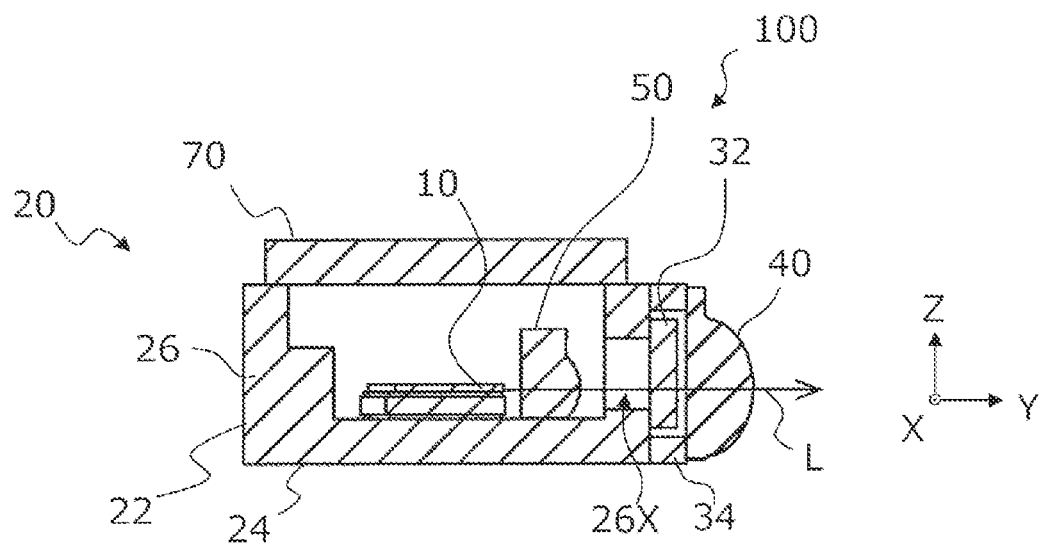
FIG. 15 is a schematic cross-sectional view of a light emitting device according to the third embodiment.
Figure 16:
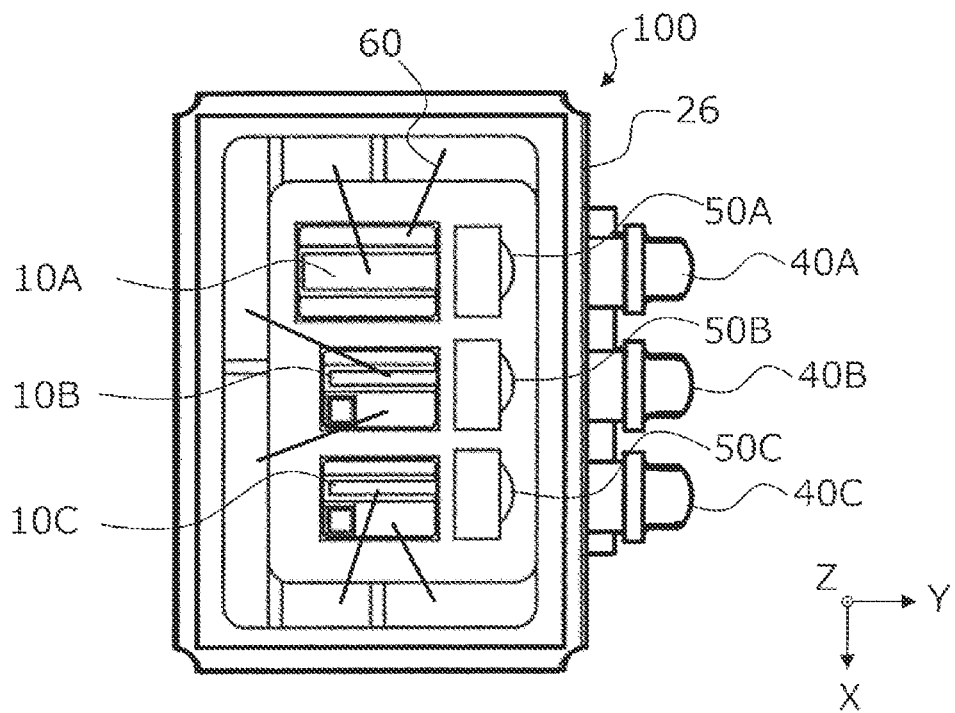
FIG. 16 is a schematic plan view showing an internal configuration of a light emitting device according to the third embodiment.

Next, with reference to FIG. 15 and FIG. 16, the structure of the light emitting device 100 according to the third embodiment will be further described. FIG. 15 is a schematic cross-sectional view showing the light emitting device 100 according to the third embodiment. FIG. 16 is a schematic plan view showing a structure of an interior of the light emitting device 100, in which a lid 70 is not shown.

As shown in FIG. 15, in the third embodiment, a through opening 26X is formed in a lateral surface, more specifically, a portion of the frame portion 26 of the case 20. The through opening 26X of the frame portion 26 is covered by a cover 32. The main lenses 40 are secured to the frame portion 26 via a bonding layer 34. Alternatively, the main lenses 40 may be secured to the cover 32.

Light L is emitted from each of the light emitting elements 10A, 10B, and 10C in the positive Y-axis. Three sub-lenses 50 are disposed in the interior of the case 20 to transmit light emitted from a corresponding one of the three light emitting elements 10.

The lid 70 is not required to have a light-transmissive portion, but the cover 32 is required to have a light-transmissive portion. At least a portion of the cover 32 to transmit light L is made of a light-transmissive material. Light L that has passed through each one of the sub-lenses 50 can be collimated or converged by a corresponding one of the main lenses 40. Adjustment and securing of each of the sub-lenses 50 can be performed as described in the first embodiment. The light emitting device 100 according to the third embodiment also includes the electrode structure and wires as described above.

According to the structure in the third embodiment, a reflector R is not required in the light emitting device 100, which allows a reduction in the number of components, which in turn allows a reduction in the dimensions of the light emitting device 100.

The embodiments described above are intended as illustrative of a light emitting device to give a concrete form to technical ideas of the present invention, and the scope of the invention is not limited to those described below. Further, the members shown in claims attached hereto are not specifically limited to members according to embodiments. The sizes, materials, shapes and the relative configuration etc. of components described in the embodiments are given as an example and not as a limitation to the scope of the invention, unless specifically described otherwise.

In addition, in the present disclosure, a plurality of structural elements may be configured as a single part that serves the purpose of a plurality of elements, and on the other hand, a single structural element may be configured as a plurality of parts that serve the purpose of a single element.

The light emitting devices according to the present disclosure can be used as light sources of projectors, vehicular headlights, lighting devices, communication devices, laser machining devices, etc.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a laser element;
   a case enclosing the laser element, the case comprising:
      a base comprising:
         a bottom portion having an upward-facing surface on which the laser element is directly or indirectly disposed, and
         a frame portion surrounding the laser element and having a lateral surface that intersects with the upward-facing surface, and
      a cover comprising a light-transmissive region configured to allow light emitted from the laser element to transmit through the light-transmissive region;
   a first lens disposed outside the case and configured to collimate or converge light emitted from the laser element; and
   a second lens that is attached to the upward-facing surface of the bottom portion of the base and spaced apart from the first lens, the second lens located in an optical path between the laser element and the first lens; wherein:
   the second lens is spaced apart from the light-transmissive region such that an open space is located in the case between the light-transmissive region and the second lens;
   the laser element has an end surface comprising a light-emitting region from which the light is emitted from the laser element, the end surface extending in a plane that intersects the upward-facing surface of the bottom portion of the case; and
   a straight line extending perpendicularly from the end surface passes through the second lens.

2. The light emitting device according to claim 1, wherein:
   the second lens is a sub-lens that compensates for an alignment deviation between the first lens and the laser element.

3. The light emitting device according to claim 2, wherein:
   a position and an orientation of the second lens is such that a focal point of a combination of the first lens and the sub-lens is on the end surface of the laser element.

4. The light emitting device according to claim 1, wherein:
   the second lens is spaced apart from the laser element.

5. The light emitting device according to claim 1, wherein:
   the first lens is secured directly or indirectly to the light-transmissive region of the case.

6. The light emitting device according to claim 1, wherein:
   an opening extends through the frame portion.

7. The light emitting device according to claim 6, wherein:
   the cover covers the opening.

8. The light emitting device according to claim 1, wherein:
   the laser element is a first laser element; and
   the light emitting device further comprises:
   a second laser element enclosed by the case, wherein the light-transmissive region of the cover is configured to allow light emitting from the second laser element to transmit through the light-transmissive region;
   an additional first lens configured to collimate or converge light emitted from the second laser element; and
   an additional second lens that is attached to the upward-facing surface of the bottom portion of the base and spaced apart from the additional first lens, the additional second lens located in an optical path between the second laser element and the additional first lens; wherein:
   the additional second lens is spaced apart from the light-transmissive region such that the open space is located in the case between the light-transmissive region and the additional second lens.

9. The light emitting device according to claim 8, wherein:
   the first laser element is configured to emit light having a first peak wavelength; and
   the second laser element is configured to emit light having a second peak wavelength that is different from the first peak wavelength.

10. The light emitting device according to claim 1, further comprising:
    a submount disposed on the upward-facing surface of the bottom portion of the case; wherein:
    the laser element is indirectly disposed on the upward-facing surface of the bottom portion of the case via the submount.

11. The light emitting device according to claim 1, wherein:
    the first lens comprises a plate-shaped portion, and a convex portion protruding from the plate-shaped portion.

12. A light emitting device comprising:
    a laser element;
    a case enclosing the laser element, the case comprising:
       a base comprising:
          a bottom portion having an upward-facing surface on which the laser element is directly or indirectly disposed, and
          a frame portion surrounding the laser element and having a lateral surface that intersects with the upward-facing surface, and
       a cover comprising a light-transmissive region configured to allow light emitted from the laser element to transmit through the light-transmissive region;
    a first lens attached to the cover by a bonding layer and configured to collimate or converge light emitted from the laser element; and
    a second lens that is attached to the upward-facing surface of the bottom portion of the base and spaced apart from the first lens, the second lens located in an optical path between the laser element and the first lens; wherein:
    the second lens is spaced apart from the light-transmissive region such that an open space is located in the case between the light-transmissive region and the second lens;

the laser element has an end surface comprising a light-emitting region from which the light is emitted from the laser element, the end surface extending in a plane that intersects the upward-facing surface of the bottom portion of the case; and a straight line extending perpendicularly from the end surface passes through the second lens.

13. The light emitting device according to claim 12, wherein:

the first lens comprises a plate-shaped portion, and a convex portion protruding from the plate-shaped portion.

14. A light emitting device comprising:

a laser element;

a case enclosing the laser element, the case comprising a bottom portion having an upward-facing surface on which the laser element is directly or indirectly disposed, and a light-transmissive region configured to allow light emitted from the laser element to transmit through the light-transmissive region;

a first lens configured to collimate or converge light emitted from the laser element; and a second lens that is attached to the upward-facing surface of the bottom portion of the base and spaced apart from the first lens, the second lens located in an optical path between the laser element and the first lens without any intervening lens between the second lens and the first lens; wherein:

the second lens is spaced apart from the light-transmissive region such that an open space is located in the case between the light-transmissive region and the second lens;

the laser element has an end surface comprising a light-emitting region from which the light is emitted from the laser element, the end surface extending in a plane that intersects the upward-facing surface of the bottom portion of the case; and a straight line extending perpendicularly from the end surface passes through the second lens.

15. The light emitting device according to claim 14, wherein:

the first lens comprises a plate-shaped portion, and a convex portion protruding from the plate-shaped portion.

* * * * *